United States Patent
Andres et al.

(10) Patent No.: US 7,939,817 B2
(45) Date of Patent: May 10, 2011

(54) INTEGRATED CIRCUIT INCLUDING MEMORY ELEMENT WITH SPATIALLY STABLE MATERIAL

(75) Inventors: Dieter Andres, Munich (DE); Thomas Happ, Dresden (DE); Petra Majewski, Munich (DE); Bernhard Ruf, Sauerlach (DE)

(73) Assignee: Qimonda AG, Munich (DE)

( * ) Notice: Subject to any disclaimer, the term of this patent is extended or adjusted under 35 U.S.C. 154(b) by 218 days.

(21) Appl. No.: 12/167,886

(22) Filed: Jul. 3, 2008

(65) Prior Publication Data
US 2009/0050870 A1  Feb. 26, 2009

(51) Int. Cl.
*H01L 47/00* (2006.01)
(52) U.S. Cl. ......... 257/4; 257/2; 257/330; 257/E45.002; 257/E21.001
(58) Field of Classification Search .................. 257/1–5, 257/38, 55, 612, 289–296
See application file for complete search history.

(56) References Cited

U.S. PATENT DOCUMENTS

| 6,869,883 | B2 | 3/2005 | Chiang et al. | |
|---|---|---|---|---|
| 7,196,351 | B2 | 3/2007 | Chiang et al. | |
| 2008/0210923 | A1* | 9/2008 | Sato | 257/4 |
| 2009/0303780 | A1* | 12/2009 | Kasko et al. | 365/163 |

OTHER PUBLICATIONS

J.H. Oh et al., "Full Integration of Highly Manufacturable 512Mb PRAM based on 90nm Technology", IEEE, 1-4244-0439, Aug. 2006.
Kinan Kim et al., "Reliability Investigations for Manufacturable High Density PRAM", IEEE 05CH37616 43rd Annual International Reliability Physics Symposium, San Jose, 2005, pp. 157-162.
S.J. Ahn et al., "Highly Reliable 50nm Contact Cell Technology for 256Mb PRAM", 2005 Symposium on VLSI Technology Digest of Technical Papers.
Manzur Gill et al., "Ovonic Unified Memory—A High-performance Nonvolatile Memory Technology for Stand Alone Memory and Embedded Applications".
Stefan Lai et al., "OUM—A 180 nm Nonvolatile Memory Cell Element Technology for Stand Alone and Embedded Applications".

* cited by examiner

*Primary Examiner* — Dung A. Le
(74) *Attorney, Agent, or Firm* — Edell, Shapiro & Finnan, LLC (57) ABSTRACT

An integrated circuit includes a heater element serving as a first electrode, a second electrode, a memory element comprising resistance changing material coupled to the heater element and to the second electrode, and a diffusion compensation region coupled to the heater element and to the resistance changing material. The diffusion compensation region includes a surplus of at least one diffusible species present in the memory element and provides at least one diffusible species to the memory element.

16 Claims, 8 Drawing Sheets

INTEGRATED CIRCUIT INCLUDING MEMORY ELEMENT WITH SPATIALLY STABLE MATERIAL

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state—"set"—and from the crystalline state to the amorphous state—"reset"—in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material. Not all of the phase change material is necessarily heated in a phase change operation. Regions or zones without phase change during heating are called inactive zones. Regions or zones with phase change during heating are called active zones.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

During cycling of the phase change material between amorphous and crystalline states the phase change material may re-distribute and may undergo a compositional degradation in the active zones. Parts of the phase change material's composition may agglomerate or dilute yielding in different chemical compositions between active and inactive regions of the phase change material. The spatial re-distribution may end in a shift of operation parameters of the memory cell. For future technology nodes it is desirable to produce phase change memories having stability against spatial material re-distribution and spatial degradation of the phase change material.

SUMMARY

One embodiment provides an integrated circuit. The integrated circuit includes a heater element serving as a first electrode, a second electrode, a memory element coupled to the heater element and to the second electrode, the memory element comprising resistance changing material, and a diffusion compensation region coupled to the heater element and to the resistance changing material. The diffusion compensation region comprises a surplus of at least one diffusible species present in the memory element and provides at least one diffusible species to the memory element.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various embodiments described herein may be combined with each other, unless specifically noted otherwise.

Figure 1:
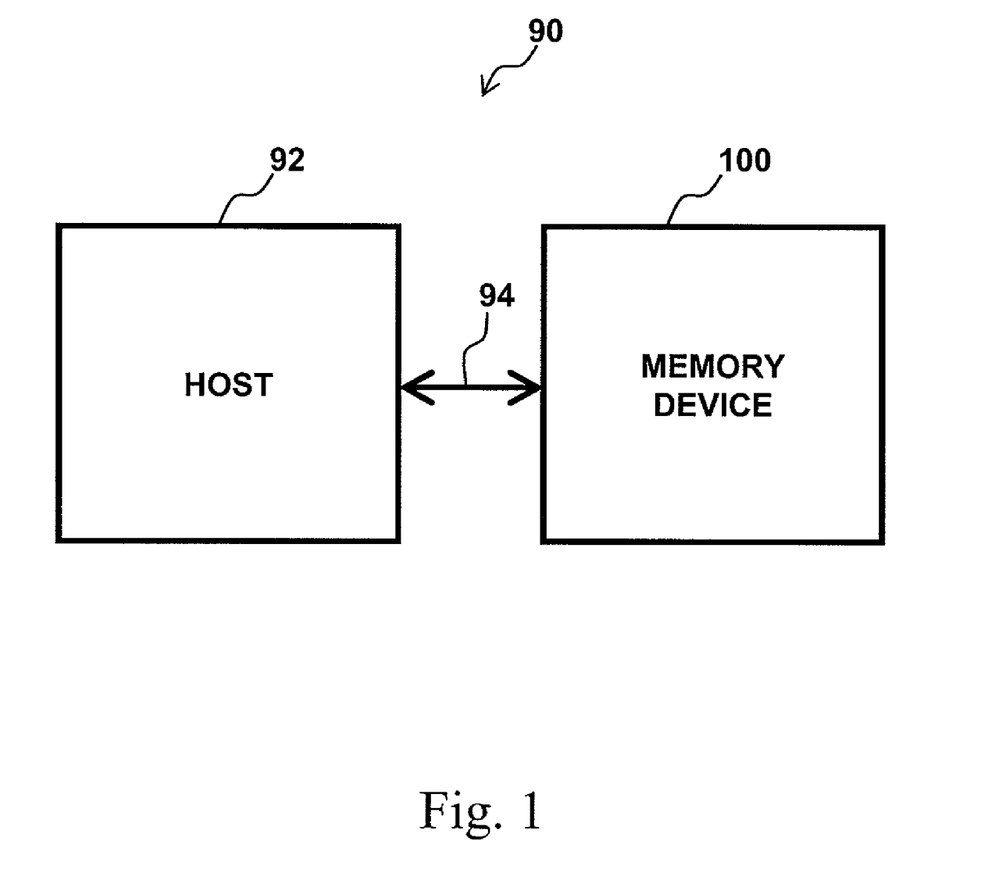
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a microprocessor, computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In one embodiment, memory device 100 includes a phase change memory device or other suitable resistive or resistivity changing material memory device.

Figure 2:
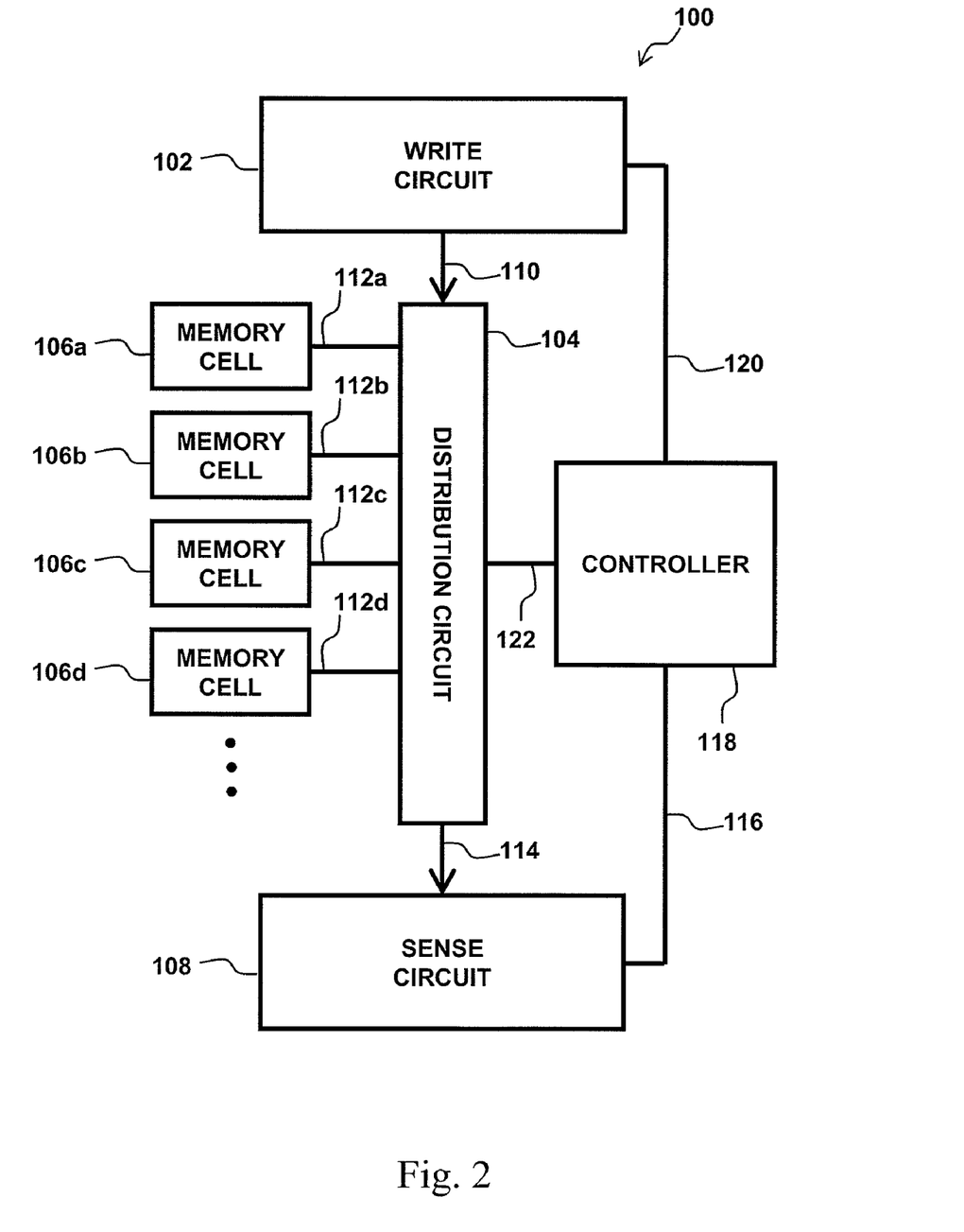
FIG. 2 is a block diagram illustrating one embodiment of a memory device.

FIG. 2 is a block diagram illustrating one embodiment of memory device 100. In one embodiment, memory device 100 is an integrated circuit or part of an integrated circuit. Memory device 100 includes a write circuit 102, a distribution circuit 104, memory cells 106a, 106b, 106c, and 106d, a controller 118, and a sense circuit 108. Each of the memory cells 106a-106d is a phase change memory cell that stores data based on the amorphous and crystalline states of phase change material in the memory cell. Also, each of the memory cells 106a-106d can be programmed into one of two or more states by programming the phase change material to have intermediate resistance values. To program one of the memory cells 106a-106d to an intermediate resistance value, the amount of crystalline material coexisting with amorphous material and hence the cell resistance is controlled using a suitable write strategy.

Each of the memory cells 106a-106d includes phase change material. The phase change material is deposited over a bottom electrode. The phase change material is deposited using chemical vapor deposition (CVD), atomic layer deposition (ALD), physical vapor deposition (PVD), solution based spin-on, or other suitable deposition technique.

As used herein, the term "electrically coupled" is not meant to mean that the elements must be directly coupled together and intervening elements may be provided between the "electrically coupled" elements.

Write circuit 102 is electrically coupled to distribution circuit 104 though signal path 110. Distribution circuit 104 is electrically coupled to each of the memory cells 106a-106d through signal paths 112a-112d. Distribution circuit 104 is electrically coupled to memory cell 106a through signal path 112a. Distribution circuit 104 is electrically coupled to memory cell 106b through signal path 112b. Distribution circuit 104 is electrically coupled to memory cell 106c through signal path 112c. Distribution circuit 104 is electrically coupled to memory cell 106d through signal path 112d. Distribution circuit 104 is electrically coupled to sense circuit 108 through signal path 114. Sense circuit 108 is electrically coupled to controller 118 through signal path 116. Controller 118 is electrically coupled to write circuit 102 through signal path 120 and to distribution circuit 104 through signal path 122.

Each of the memory cells 106a-106d includes a phase change material that may be changed from an amorphous state to a crystalline state or from a crystalline state to an amorphous state under the influence of temperature change. The amount of crystalline phase change material coexisting with amorphous phase change material in one of the memory cells 106a-106d thereby defines two or more states for storing data within memory device 100.

In the amorphous state, a phase change material exhibits significantly higher resistivity than in the crystalline state. Therefore, the two or more states of memory cells 106a-106d differ in their electrical resistivity. In one embodiment, the two or more states include two states and a binary system is used, wherein the two states are assigned bit values of "0" and "1". In another embodiment, the two or more states include three states and a ternary system is used, wherein the three states are assigned bit values of "0", "1", and "2". In another embodiment, the two or more states include four states that are assigned multi-bit values, such as "00", "01", "10", and "11". In other embodiments, the two or more states can be any suitable number of states in the phase change material of a memory cell.

Controller 118 controls the operation of write circuit 102, sense circuit 108, and distribution circuit 104. Controller 118 includes a microprocessor, microcontroller, or other suitable logic circuitry for controlling the operation of write circuit 102, sense circuit 108, and distribution circuit 104. Controller 118 controls write circuit 102 for setting the resistance states of memory cells 106a-106d. Controller 118 controls sense circuit 108 for reading the resistance states of memory cells 106a-106d. Controller 118 controls distribution circuit 104 for selecting memory cells 106a-106d for read or write access. In one embodiment, controller 118 is embedded on the same chip as memory cells 106a-106d. In another embodiment, controller 118 is located on a separate chip from memory cells 106a-106d.

In one embodiment, write circuit 102 provides voltage pulses to distribution circuit 104 through signal path 110, and distribution circuit 104 controllably directs the voltage pulses to memory cells 106a-106d through signal paths 112a-112d. In another embodiment, write circuit 102 provides current pulses to distribution circuit 104 through signal path 110, and distribution circuit 104 controllably directs the current pulses to memory cells 106a-106d through signal paths 112a-112d. In one embodiment, distribution circuit 104 includes a plurality of transistors that controllably direct the voltage pulses or the current pulses to each of the memory cells 106a-106d. In another embodiment, distribution circuit 104 includes a plurality of diodes that controllably direct the voltage pulses or the current pulses to each of the memory cells 106a-106d.

Sense circuit 108 reads each of the two or more states of memory cells 106a-106d through signal path 114. Distribution circuit 104 controllably directs read signals between sense circuit 108 and memory cells 106a-106d through signal paths 112a-112d. In one embodiment, distribution circuit 104 includes a plurality of transistors that controllably direct read signals between sense circuit 108 and memory cells 106a-106d. In one embodiment, to read the resistance of one of the memory cells 106a-106d, sense circuit 108 provides current that flows through one of the memory cells 106a-106d and sense circuit 108 reads the voltage across that one of the memory cells 106a-106d. In another embodiment, sense circuit 108 provides voltage across one of the memory cells 106a-106d and reads the current that flows through that one of the memory cells 106a-106d. In another embodiment, write circuit 102 provides voltage across one of the memory cells 106a-106d and sense circuit 108 reads the current that flows through that one of the memory cells 106a-106d. In another embodiment, write circuit 102 provides current through one of the memory cells 106a-106d and sense circuit 108 reads the voltage across that one of the memory cells 106a-106d.

To program a memory cell 106a-106d within memory device 100, write circuit 102 generates one or more current or voltage pulses for heating the phase change material in the target memory cell. In one embodiment, write circuit 102 generates appropriate current or voltage pulses, which are fed into distribution circuit 104 and distributed to the appropriate target memory cell 106a-106d. The amplitude and duration of the current or voltage pulses are controlled depending on whether the memory cell is being set or reset.

Generally, a "set" operation of a memory cell is heating the phase change material of the target memory cell above its crystallization temperature (but usually below its melting temperature) long enough to achieve the crystalline state or a partially crystalline and partially amorphous state. Generally, a "reset" operation of a memory cell is heating the phase change material of the target memory cell above its melting temperature, and then quickly quench cooling the material, thereby achieving the amorphous state or a partially amorphous and partially crystalline state.

During "set" operation or "reset" operation the phase change material is partially heated. That portion of the phase change material which is effectively heated and which changes from crystalline to amorphous state or vice versa is called the active portion of the phase change material or the active zone/region. That portion of the phase change material which is not sufficiently heated for phase transition (which is not changing from crystalline to amorphous state or vice versa) is called the inactive portion of the phase change material or the inactive zone/region.

Figure 3A:
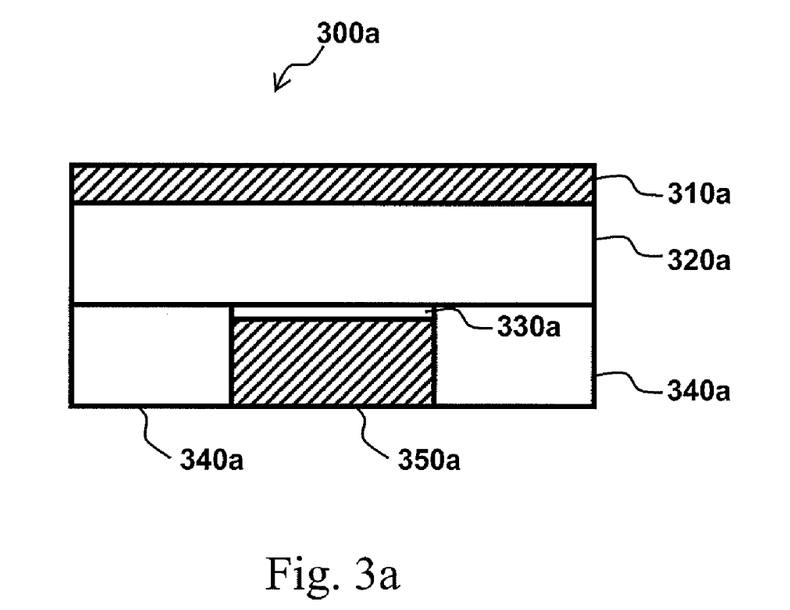
FIG. 3a illustrates a cross-sectional view of one embodiment of a phase change memory cell.

FIG. 3a illustrates a cross-sectional view of one embodiment of a phase change memory cell 300a. In one embodiment, each of the phase change memory cells 106a-106d previously described and illustrated with reference to FIG. 2 is similar to phase change memory cell 300a. Phase change memory cell 300a includes a heater element 350a as a first electrode, a phase change memory element 320a, a second electrode 310a, dielectric material 340a, and a diffusion compensation region 330a.

Heater element 350a includes one or more of: TiN, TaN, W, Al, Ti, Ta, TiSiN, TaSiN, TiAlN, TaAlN, WN, C, CN, TaCN, or other suitable heater material. The heater element 350a is deposited using chemical vapor deposition (CVD), atomic layer deposition (ALD), physical vapor deposition (PVD), solution based spin-on, or other suitable deposition technique. The top of heater element 350a contacts the bottom of diffusion compensation region 330a.

Diffusion compensation region 330a includes Ge, GeN, Te, GeTe, GeW, TiGe, or any other suitable material to provide diffusible species to phase change element 320a. The material of the diffusion compensation region 330a is deposited using chemical vapor deposition (CVD), atomic layer deposition (ALD), physical vapor deposition (PVD), solution based spin-on, or other suitable deposition technique.

Generally, the material of diffusion compensation region 330a and its concentration is selected to stabilize memory element 320a against spatial material re-distribution and spatial degradation of the resistance changing material in phase change element 320a during operation. Diffusion compensation region 330a includes a surplus of at least one species which is out-diffusing from the active zone of memory element 320a during heating.

In one embodiment, diffusion compensation region 330a has no content of Antimony (Sb). In another embodiment, diffusion compensation region 330a has at least one of Germanium (Ge) or Tellurium (Te). In one embodiment, the concentration of at least one diffusible species in the diffusion compensation region 330a is at least one atomic percent. The top of diffusion compensation region 330a contacts the bottom of phase change element 320a.

In one embodiment, phase change memory element 320a comprises a phase change material that may be made up of a variety of materials. Generally, chalcogenide alloys that contain one or more elements from Group VI of the periodic table are useful as such materials. In one embodiment, the phase change material is made up of a chalcogenide compound material, such as GeSbTe (GST), SbTe, GeTe, AgInSbTe, $Ge_2Sb_2Te_5$, InSbTe, (GeSn)SbTe, GaSeTe, GeSb(SeTe), $SnSb_2Te_4$, $Te_{81}Ge_{15}Sb_2S_2$, or $Sb_2Te_3$. In another embodiment, the phase change material is chalcogen free, such as GeSb, GaSb, InSb, or GeGaInSb, InSe, or InSbGe. In further embodiments, Bi replaces Sb in the aforementioned materials. In other embodiments, the phase change material is made up of any suitable material including one or more of the elements Ge, Sb, Te, Ga, As, In, Ge, Se, Ag, Bi, and S.

The active zone in phase change element 320a is at or close to the interface area between diffusion compensation region 330a and phase change memory element 320a within the phase change material. The inactive zone in phase change memory element 320a is at or close to the interface area between second electrode 310a and phase change memory element 320a within the phase change material. Phase change memory element 320a has a greater cross-sectional width than first electrode 350a (so called "mushroom" concept).

The top of phase change memory element 320a contacts the bottom of second electrode 310a. Second electrode 310a includes TiN, TaN, W, Al, Ti, Ta, TiSiN, TaSiN, TiAlN, TaAlN, WN, C, CN, TaCN, or other suitable electrode material. The second electrode 310a is deposited using chemical vapor deposition (CVD), atomic layer deposition (ALD), physical vapor deposition (PVD), solution based spin-on, or other suitable deposition technique.

Dielectric material 340a laterally surrounds heater element 350a and diffusion compensation region 330a. Dielectric material 340a includes $SiO_2$, $SiO_x$, SiN, SiON, $AlO_x$, fluorinated silica glass (FSG), boro-phosphorus silicate glass (BPSG), boro-silicate glass (BSG), or other suitable dielectric material. The dielectric material 340a is deposited using chemical vapor deposition (CVD), atomic layer deposition (ALD), physical vapor deposition (PVD), solution based spin-on, or other suitable deposition technique.

Phase change memory element 320a provides a storage location for storing one or more bits of data. During operation of memory cell 300a, current or voltage pulses are applied between heater element 350a and second electrode 310a to program the memory cell. A part of the active zone in phase change memory element 320a is at or close to the interface area between diffusion compensation region 330a and phase change memory element 320a.

During a "set" operation of memory cell 300a, one or more set current or voltage pulses are selectively enabled by write circuit 102 and sent to heater element 350a or second electrode 310a. From heater element 350a or second electrode 310a, the set current or voltage pulses pass through phase change memory element 320a thereby heating the phase change material above its crystallization temperature (but usually below its melting temperature). In this way, the phase change material reaches a crystalline state or a partially crystalline and partially amorphous state during the "set" operation.

During a "reset" operation of memory cell 300a, a reset current or voltage pulse is selectively enabled by write circuit 102 and sent to heater element 350a or second electrode 310a. From heater element 350a or second electrode 310a, the reset current or voltage pulse passes through phase change memory element 320a. The reset current or voltage quickly heats the phase change material above its melting temperature. After the current or voltage pulse is turned off, the phase change material quickly quench cools into an amorphous state or a partially amorphous and partially crystalline state.

Figure 3B:
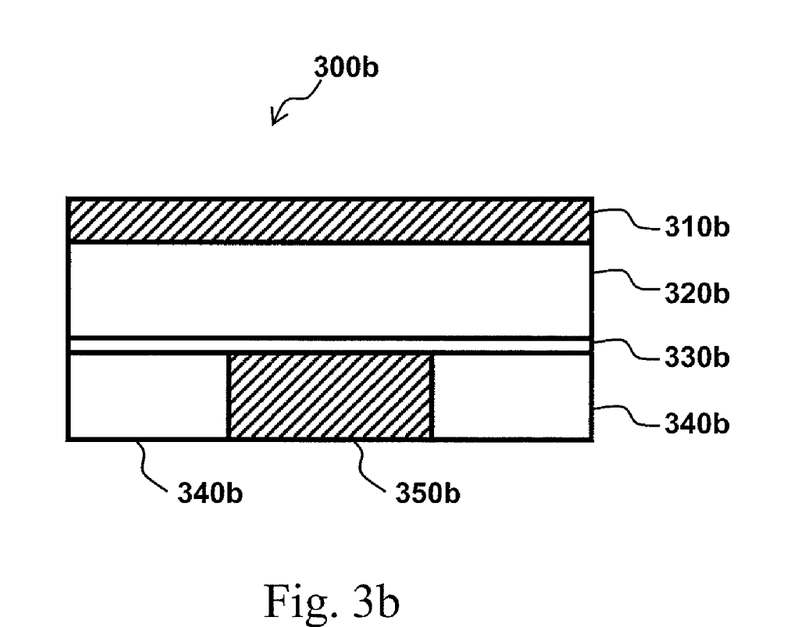
FIG. 3b illustrates a cross-sectional view of another embodiment of a phase change memory cell.

FIG. 3b illustrates a cross-sectional view of another embodiment of a phase change memory cell 300b. Memory cell 300b includes a heater element 350b as a first electrode, a phase change memory element 320b, a second electrode 310b, dielectric material 340b, and a diffusion compensation region 330b. Dielectric material 340b laterally surrounds heater element 350b. Memory element 320b includes phase change material. Phase change material 320b includes "standard" phase change material for storing data in memory cell 300b. In contrast to FIG. 3a, diffusion compensation region 330b extends laterally over heater element 350b. In one embodiment, diffusion compensation region 330b has no content of Antimony (Sb). In another embodiment, the concentration of at least one diffusible species in the diffusion compensation region 330b is at least one atomic percent. In one embodiment, diffusion compensation region 330b has at least one of Germanium (Ge) or Tellurium (Te).

The active zone in phase change memory element 320b is at or close to the interface area between diffusion compensation region 330b and phase change memory element 320b within the phase change material. The inactive zone in phase change element 320b is at or close to the interface area between second electrode 310b and phase change memory element 320b within the phase change material. Phase change memory element 320b has a greater cross-sectional width than heater element 350b (so called "mushroom" concept).

Figure 3C:
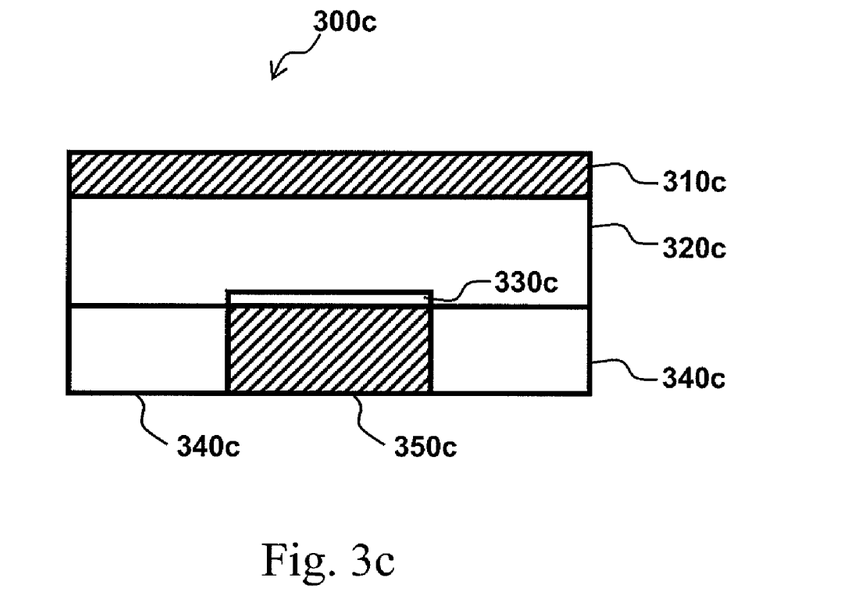
FIG. 3c illustrates a cross-sectional view of another embodiment of a phase change memory cell.

FIG. 3c illustrates a cross-sectional view of another embodiment of a phase change memory cell 300c. Memory cell 300c includes a heater element 350c as a first electrode, a phase change memory element 320c, a second electrode 310c, dielectric material 340c, and a diffusion compensation region 330c. Dielectric material 340c laterally surrounds heater element 350c. Memory element 320c includes phase change material. Phase change material 320c includes "standard" resistance changing material for storing data in memory cell 300c. In contrast to FIG. 3a, diffusion compensation region 330c is embedded into phase change material 320c, whereby diffusion compensation region 330c has contact to phase change material 320c laterally and horizontally. In one embodiment, diffusion compensation region 330c has no content of Antimony (Sb). In another embodiment, diffusion compensation region 330c has at least one of Germanium (Ge) or Tellurium (Te). In one embodiment, the concentration of at least one diffusible species in the diffusion compensation region 330c is at least one atomic percent.

The active zone in phase change memory element 320c is at or close to the interface area between diffusion compensation region 330c and phase change memory element 320c within the phase change material. The inactive zone in phase change element 320c is at or close to the interface area between second electrode 310c and phase change memory element 320c within the phase change material. Phase change memory element 320c has a greater cross-sectional width than heater element 350c (so called "mushroom" concept).

Figure 4A:
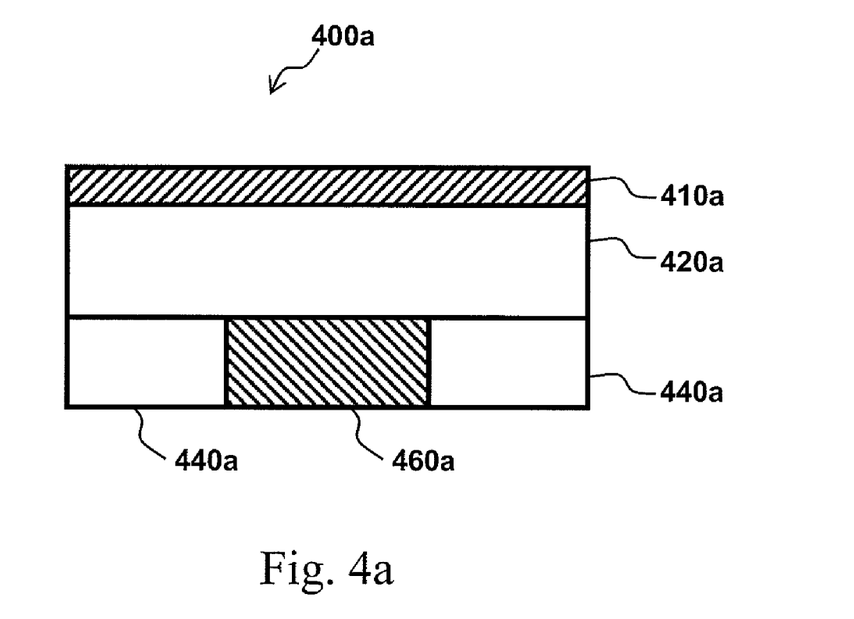
FIG. 4a illustrates a cross-sectional view of another embodiment of a phase change memory cell.

FIG. 4a illustrates a cross-sectional view of another embodiment of a phase change memory cell 400a. Memory cell 400a includes a heater element 460a as a first electrode, a phase change memory element 420a, a second electrode 410a, and dielectric material 440a. Dielectric material 440a laterally surrounds heater element 460a. Memory element 420a includes phase change material. Phase change material 420a includes "standard" phase change material for storing data in memory cell 400a. The diffusion compensation region is embedded into heater element 460a by doping heater element 460a with diffusible species present in the phase change memory element 420a. In one embodiment, the heater element 460a was doped by co-sputtering. In another embodiment, the doping was by diffusion technique, ion-implantation, or any other suitable doping technique.

In one embodiment, diffusion compensation region embedded into heater element 460a has no content of Antimony (Sb). In another embodiment, diffusion compensation region embedded into heater element 460a has at least one of Germanium (Ge) or Tellurium (Te). In one embodiment, the concentration of at least one diffusible species in the diffusion compensation region is at least one atomic percent.

The active zone in phase change memory element 420a is at or close to the interface area between heater element 460a and phase change memory element 420a within the phase change material. The inactive zone in phase change element 420a is at or close to the interface area between second electrode 410a and phase change memory element 420a within the phase change material. Phase change memory element 420a has a greater cross-sectional width than heater element 450a (so called "mushroom" concept).

Figure 4B:
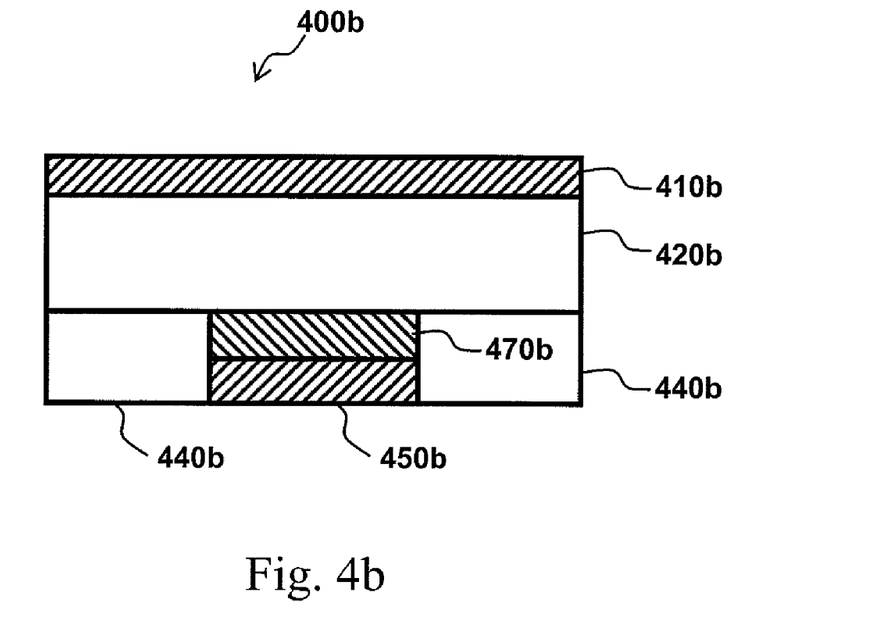
FIG. 4b illustrates a cross-sectional view of another embodiment of a phase change memory cell.

FIG. 4b illustrates a cross-sectional view of another embodiment of a phase change memory cell 400b. Memory cell 400b includes a heater element 450b as a first electrode, a phase change memory element 420b, a second electrode 410b, dielectric material 440b, and diffusion compensation region 470b. Dielectric material 440b laterally surrounds heater element 450b and diffusion compensation region 470b. Memory element 420b includes phase change material. Phase change material 420b includes "standard" phase change material for storing data in memory cell 400b. The diffusion compensation region 470b is embedded into heater material by doping with diffusible species present in the phase change memory element 420b. In one embodiment, the diffusion compensation region 470b was doped by co-sputtering. In another embodiment, the doping was by diffusion technique, ion-implantation, or any other suitable doping technique.

In one embodiment, diffusion compensation region 470b embedded into heater material has no content of Antimony (Sb). In another embodiment, diffusion compensation region 470b has at least one of Germanium (Ge) or Tellurium (Te). In one embodiment, the concentration of at least one diffusible species in the diffusion compensation region 470b is at least one atomic percent.

The active zone in phase change memory element 420b is at or close to the interface area between diffusion compensation region 470b and phase change memory element 420b within the phase change material. The inactive zone in phase change element 420b is at or close to the interface area between second electrode 410b and phase change memory element 420b within the phase change material. Phase change memory element 420b has a greater cross-sectional width than heater element 450b (so called "mushroom" concept).

Figure 4C:
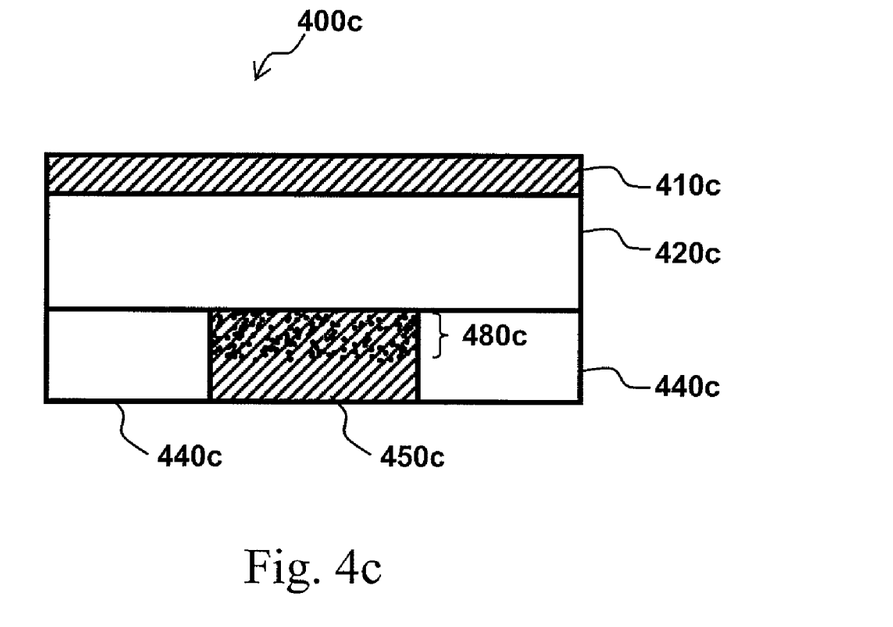
FIG. 4c illustrates a cross-sectional view of another embodiment of a phase change memory cell.

FIG. 4c illustrates a cross-sectional view of another embodiment of a phase change memory cell 400c. Memory cell 400c includes a heater element 450c as a first electrode, a phase change memory element 420c, a second electrode 410c, dielectric material 440c, and diffusion compensation region 480c. Dielectric material 440c laterally surrounds heater element 450c. Memory element 420c includes phase change material. Phase change material 420c includes "standard" phase change material for storing data in memory cell 400c. The diffusion compensation region 480c is embedded into heater element 450c by ion-implanting of diffusible species present in the phase change memory element 420c. The top part of the heater element 450c is implanted by ions, resulting in a top zone 480c of heater element 450c with implanted diffusible species. The heater element 450c was ion-implanted by any suitable implanting technique.

In one embodiment, diffusion compensation region 480c has no content of Antimony (Sb). In another embodiment, diffusion compensation region 480c has at least one of Germanium (Ge) or Tellurium (Te). In one embodiment, the concentration of at least one diffusible species in the diffusion compensation region 480c is at least one atomic percent.

The active zone in phase change memory element 420c is at or close to the interface area between diffusion compensation region 480c and phase change memory element 420c within the phase change material. The inactive zone in phase change element 420c is at or close to the interface area between second electrode 410c and phase change memory element 420c within the phase change material. Phase change memory element 420c has a greater cross-sectional width than heater element 450c (so called "mushroom" concept).

Figure 5A:
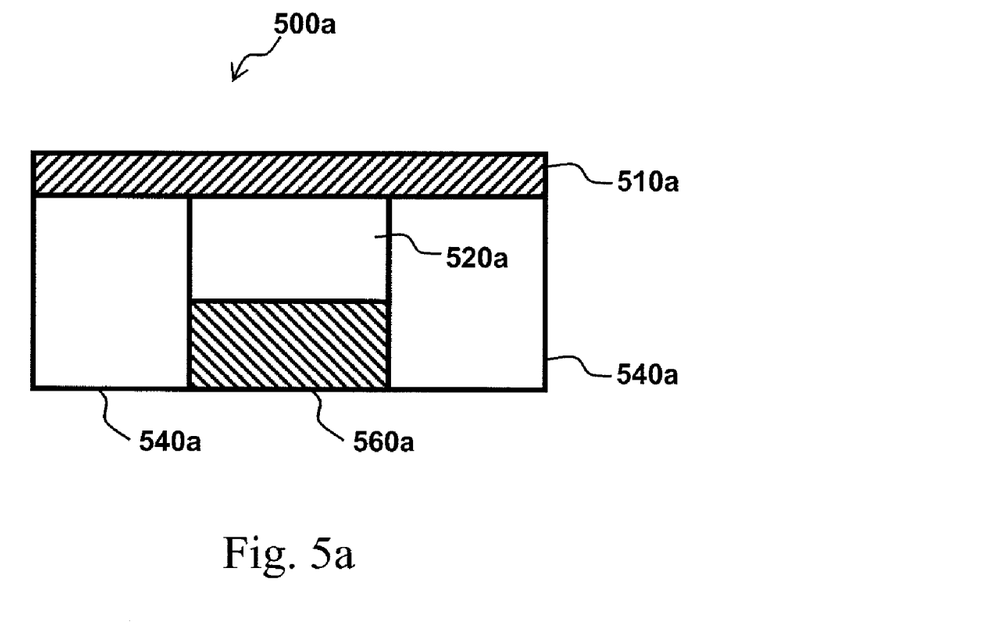
FIG. 5a illustrates a cross-sectional view of another embodiment of a phase change memory cell.
Figure 5B:
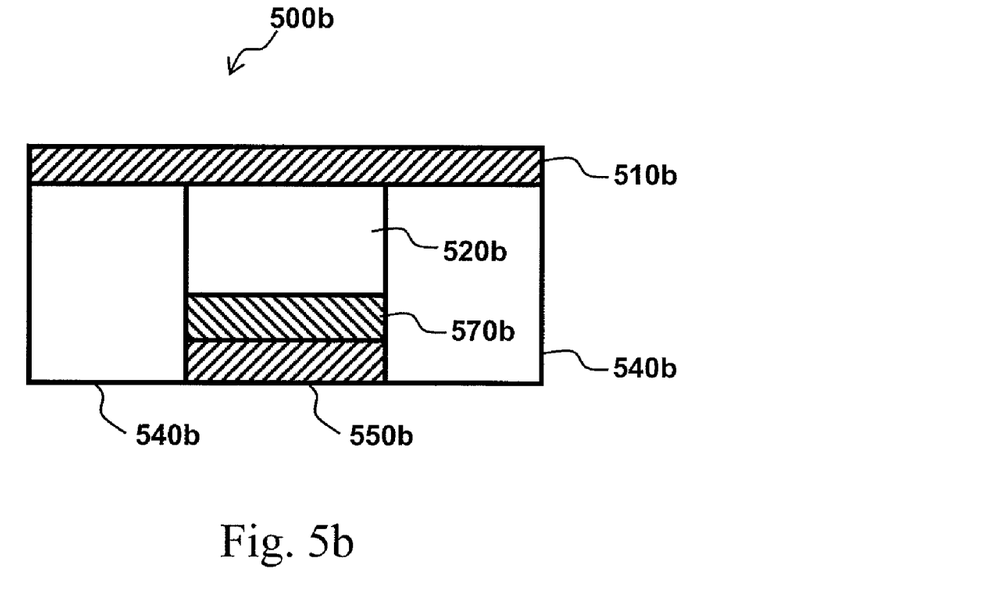
FIG. 5b illustrates a cross-sectional view of another embodiment of a phase change memory cell.
Figure 5C:
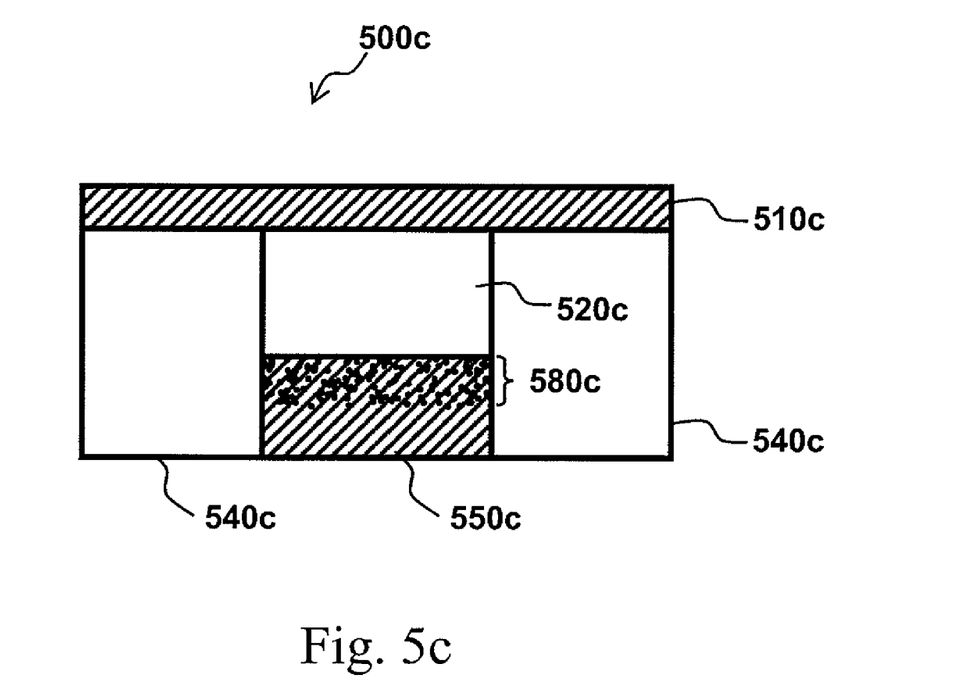
FIG. 5c illustrates a cross-sectional view of another embodiment of a phase change memory cell.

FIGS. 5a-5c illustrate phase change memory cells with phase change memory elements having nearly the same cross-sectional width than the heater elements (so called "pillar" or "pore" concept).

FIG. 5a illustrates a cross-sectional view of another embodiment of a phase change memory cell 500a. Memory cell 500a includes a heater element 560a as a first electrode, a phase change memory element 520a, a second electrode 510a, and dielectric material 540a. Dielectric material 540a laterally surrounds heater element 540a and phase change memory element 520a. Memory element 520a includes phase change material. Phase change material 520a includes "standard" phase change material for storing data in memory cell 500a. The diffusion compensation region is embedded into heater element 560a by doping heater element 560a with diffusible species present in the phase change memory element 520a. In one embodiment, the heater element 560a was doped by co-sputtering. In another embodiment, the doping was by diffusion technique, ion-implantation, or any other suitable doping technique.

In one embodiment, diffusion compensation region embedded into heater element 560a has no content of Antimony (Sb). In another embodiment, diffusion compensation region embedded into heater element 560a has at least one of Germanium (Ge) or Tellurium (Te). In one embodiment, the concentration of at least one diffusible species in the diffusion compensation region is at least one atomic percent.

The active zone in phase change memory element 520a is at or close to the interface area between heater element 560a and phase change memory element 520a within the phase change material. The inactive zone in phase change element 520a is at or close to the interface area between second electrode 510a and phase change memory element 520a within the phase change material. Phase change memory element 520a has nearly the same cross-sectional width than heater element 560a (so called "pillar" or "pore" concept).

FIG. 5b illustrates a cross-sectional view of another embodiment of a phase change memory cell 500b. Memory cell 500b includes a heater element 550b as a first electrode, a phase change memory element 520b, a second electrode 510b, dielectric material 540b, and diffusion compensation region 570b. Dielectric material 540b laterally surrounds heater element 550b, diffusion compensation region 570b, and phase change memory element 520b. Memory element 520b includes phase change material. Phase change material 520b includes "standard" phase change material for storing data in memory cell 500b. The diffusion compensation region 570b is embedded into heater material by doping with diffusible species present in the phase change memory element 520b. In one embodiment, the heater element 570b was doped by co-sputtering. In another embodiment, the doping was by diffusion technique, ion-implantation, or any other suitable doping technique.

In one embodiment, diffusion compensation region 570b embedded into heater material has no content of Antimony (Sb). In another embodiment, diffusion compensation region 570b embedded into heater material has at least one of Germanium (Ge) or Tellurium (Te). In one embodiment, the concentration of at least one diffusible species in the diffusion compensation region 570c is at least one atomic percent.

The active zone in phase change memory element 520b is at or close to the interface area between diffusion compensation region 570b and phase change memory element 520b within the phase change material. The inactive zone in phase change element 520b is at or close to the interface area between second electrode 510b and phase change memory element 520b within the phase change material. Phase change memory element 520b has nearly the same cross-sectional width than heater element 550b (so called "pillar" or "pore" concept).

FIG. 5c illustrates a cross-sectional view of another embodiment of a phase change memory cell 500c. Memory cell 500c includes a heater element 550c as a first electrode, a phase change memory element 520c, a second electrode 510c, dielectric material 540c, and diffusion compensation region 580c. Dielectric material 540c laterally surrounds heater element 550c and phase change memory element 520c. Memory element 520c includes phase change material. Phase change material 520c includes "standard" phase change material for storing data in memory cell 500c. The diffusion compensation region 580c is embedded into heater element 550c by ion-implanting of diffusible species present in the phase change memory element 520c. The top part of the heater element 550c is implanted by ions, resulting in a top zone 580c of heater element 550c with implanted diffusible species. The heater element 550c was ion-implanted by any suitable implanting technique.

In one embodiment, diffusion compensation region 580c has no content of Antimony (Sb). In another embodiment, diffusion compensation region 580c has at least one of Germanium (Ge) or Tellurium (Te). In one embodiment, the concentration of at least one diffusible species in the diffusion compensation region 580c is at least one atomic percent.

The active zone in phase change memory element 520c is at or close to the interface area between diffusion compensation region 580c and phase change memory element 520c within the phase change material. The inactive zone in phase change element 520c is at or close to the interface area between second electrode 510c and phase change memory element 520c within the phase change material. Phase change memory element 520c has nearly the same cross-sectional width than heater element 550c (so called "pillar" or "pore" concept).

Figure 6:
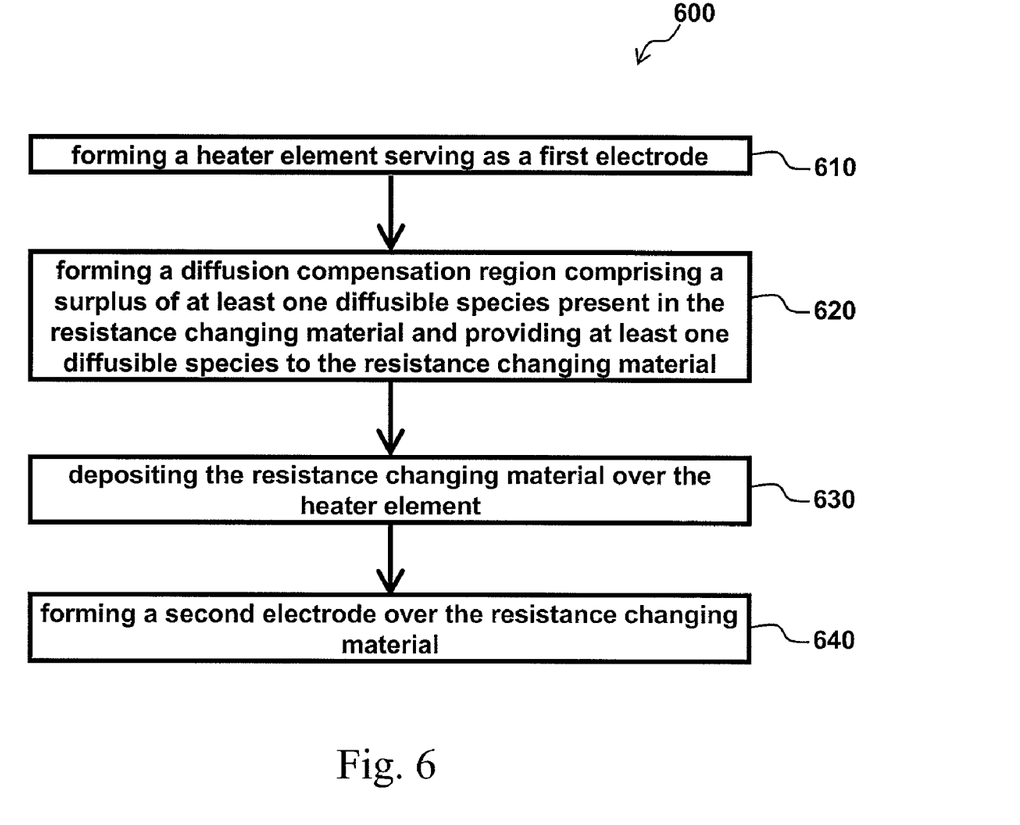
FIG. 6 illustrates a method for fabricating an integrated circuit.

FIG. 6 illustrates one embodiment of a method 600 for fabricating an integrated circuit including resistance changing material. At 610, a heater element is formed as a first electrode. At 620, a diffusion compensation region is formed. The diffusion compensation region includes a surplus of at least one diffusible species present in the resistance changing material and provides at least one diffusible species to the resistance changing material. At 630, resistance changing material is deposited over the heater element. At 640, a second electrode is formed over the resistance changing material.

Embodiments provide a phase change memory cell including a phase change element having a diffusion compensation region. In one embodiment, the phase change element includes GST. In another embodiment, the diffusion compensation region includes a surplus of at least one of Tellurium or Germanium. Other embodiments illustrate memory elements having no Antimony (Sb) in the diffusion compensation region. Diffusion compensation region is in the proximity of resistance changing material to provide at least one diffusible species to the memory element. In one embodiment, the concentration of at least one diffusible species in the diffusion compensation region is at least one atomic percent.

While the specific embodiments described herein substantially focused on fabricating phase change memory cells, the embodiments can be applied to any suitable type of resistive or resistivity changing memory cells.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit, comprising:
a heater element serving as a first electrode;
a second electrode;
a memory element coupled to the heater element and to the second electrode, the memory element comprising resistance changing material; and
a diffusion compensation region coupled to the heater element and to the resistance changing material, the diffusion compensation region comprising a surplus of at least one diffusible species present in the resistance changing material and providing at least one diffusible species to the resistance changing material.

2. The integrated circuit of claim 1, wherein the diffusion compensation region comprises a portion of the heater element that is doped or ion-implanted with the at least one diffusible species.

3. The integrated circuit of claim 1, wherein the diffusion compensation region is disposed over the heater element.

4. The integrated circuit of claim 1, wherein the concentration of at least one diffusible species in the diffusion compensation region is at least one atomic percent.

5. The integrated circuit of claim 1, wherein the resistance changing material comprises GeSbTe (GST).

6. The integrated circuit of claim 5, wherein the diffusion compensation region has a surplus of at least one of Tellurium or Germanium.

7. The integrated circuit of claim 5, wherein the diffusion compensation region contains no Antimony.

8. A system, comprising:
a host; and
a memory device communicatively coupled to the host, the memory device comprising:
a heater element serving as a first electrode;
a second electrode;
a memory element coupled to the heater element and to the second electrode, the memory element comprising resistance changing material; and
a diffusion compensation region coupled to the heater element and to the resistance changing material, the diffusion compensation region comprising a surplus of at least one diffusible species present in the memory element and providing at least one diffusible species to the memory element.

9. The system of claim 8, wherein the diffusion compensation region comprises a portion of the heater element that is doped or ion-implanted with the at least one diffusible species.

10. The system of claim 8, wherein the diffusion compensation region is disposed over the heater element.

11. The system of claim 8, wherein the concentration of at least one diffusible species in the diffusion compensation region is at least one atomic percent.

12. The system of claim 8, wherein the resistance changing material comprises GeSbTe (GST).

13. The system of claim 12, wherein the diffusion compensation region has a surplus of at least one of Tellurium or Germanium.

14. The system of claim 12, wherein the diffusion compensation region contains no Antimony.

15. An integrated circuit, comprising:
a heater element serving as a first electrode;
a second electrode;
a memory element coupled to the heater element and to the second electrode, the memory element comprising GeSbTe (GST); and
a diffusion compensation region coupled to the heater element and to the GST, the diffusion compensation region comprising a surplus of at least one of Tellurium or Germanium and providing at least one diffusible species to the resistance changing material.

16. The integrated circuit of claim 15, wherein the diffusion compensation region contains no Antimony.

* * * * *